United States Patent
Muranaka et al.

(10) Patent No.: US 6,713,232 B2
(45) Date of Patent: Mar. 30, 2004

(54) METHOD OF MANUFACTURING SEMICONDUCTOR DEVICE WITH IMPROVED REMOVAL OF RESIST RESIDUES

(75) Inventors: Seiji Muranaka, Tokyo (JP); Itaru Kanno, Tokyo (JP); Mami Shirota, Wakayama (JP); Junji Kondo, Wakayama (JP)

(73) Assignee: Kao Corporation, Tokyo (JP)

( * ) Notice: Subject to any disclaimer, the term of this patent is extended or adjusted under 35 U.S.C. 154(b) by 192 days.

(21) Appl. No.: 09/727,542

(22) Filed: Dec. 4, 2000

(65) Prior Publication Data

US 2002/0012882 A1 Jan. 31, 2002

(30) Foreign Application Priority Data

Jun. 15, 2000 (JP) .................................... 2000-180198
Jul. 25, 2000 (JP) .................................... 2000-224529

(51) Int. Cl.⁷ .............................................. G03C 5/00
(52) U.S. Cl. ................. 430/311; 430/313; 430/315; 430/317; 430/318; 430/329; 438/594; 438/622
(58) Field of Search ................. 430/313, 315, 430/317, 318, 329, 311; 438/594, 622

(56) References Cited

U.S. PATENT DOCUMENTS

| | | | |
|---|---|---|---|
| 4,491,530 A | | 1/1985 | Thomas ..................... 252/143 |
| 5,877,523 A | * | 3/1999 | Liang et al. ................. 257/315 |
| 6,159,666 A | * | 12/2000 | Ngo et al. .................. 430/329 |
| 6,296,988 B1 | * | 10/2001 | Lee ............................. 430/313 |
| 6,358,329 B1 | * | 3/2002 | Muranaka et al. ............ 134/26 |
| 6,372,050 B2 | * | 4/2002 | Honda et al. .................. 134/2 |
| 6,423,628 B1 | * | 7/2002 | Li et al. ....................... 438/622 |

FOREIGN PATENT DOCUMENTS

| | | | | |
|---|---|---|---|---|
| JP | 4-361265 | | 12/1992 | |
| JP | 6-181191 | | 6/1994 | |
| JP | 7-37846 | | 2/1995 | |
| JP | 7-219240 | | 8/1995 | |
| JP | 7-230975 | | 8/1995 | |
| JP | 9-246222 | | 9/1997 | |
| JP | 11233405 A | * | 8/1999 | ......... H01L/21/027 |

* cited by examiner

Primary Examiner—Mark F. Huff
Assistant Examiner—Daborah Chacko-Davis
(74) Attorney, Agent, or Firm—McDermott, Will & Emery

(57) ABSTRACT

Resist residues, which is formed in a process of forming Al interconnections, are removed through use of a single chemical. A chemical which contains an organic acid or a salt thereof and water and which has a pH below 8 is used as a treatment for removing resist or resist residues. The chemical may be used in a process in which Al, W, Ti, TiN, and $SiO_2$ are exposed on the surface of a wafer after etching of an Al interconnection; in a process in which Al, W, Ti, TiN, and $SiO_2$ are exposed on the surface of a wafer after etching a hole reaching an Al interconnection in an dielectric layer; in a process in which Cu is exposed on the surface of a semiconductor wafer after dry-etching of a Cu interconnection or etching of an interlayer dielectric film laid on a Cu interconnection; and in a process in which metal material such as W, WN, Ti, or TiN; poly-Si; SiN; and $SiO_2$ are exposed on the surface of a wafer after etching of a metal gate.

19 Claims, 4 Drawing Sheets

METHOD OF MANUFACTURING SEMICONDUCTOR DEVICE WITH IMPROVED REMOVAL OF RESIST RESIDUES

BACKGROUND OF THE INVENTION

1. Field of the Invention

The present invention relates to a resist stripper used in a resist stripping step carried out during a process of forming Al interconnections, W interconnections, Cu interconnections, and metal gates used in a semiconductor integrated circuit. The present invention further relates to a method of manufacturing a semiconductor device using the resist stripper.

2. Background Art

Two characteristics are desired in removal of resist residues; namely, sufficient removal of resist residues and avoidance of etching the material of interconnection and the material of an interlayer insulation film.

In a device using a current Al interconnection, the extent of removal of residues or demand for etching specifications differs from one process to another. For this reason, a chemical used for an operation following processing of Al interconnections differs from that used for an operation following etching of holes.

Against such a backdrop, a variety of types of strippers are required for removing resist residues, thus resulting in an increase in manufacturing costs. For this reason, removal of resist residues through use of a single chemical during the process of forming Al interconnections is expected.

In a process of removing resist residues following a process of processing Al interconnections of a recent minute device, large problems are posed by prevention of dissipation of W plugs, an increase in the resistance of an interconnection which would be induced by etching of AlCu, and prevention of decline in the reliability of interconnections. For this reason, a desire exists for developing a stripper for removing resist residues (hereinafter referred to simply as "resist-residue stripper") which satisfies the above-described specifications, can be used for processing operations subsequent to etching of Al interconnections and etching of holes, and can contribute to cost reduction.

The process of removing resist residues is also inevitable in processing of Al interconnections, as well as in an operation following an operation for processing W interconnections which have already been used, following an operation for processing Cu interconnections which is considered to be applied to a device in the future, and following an operation for processing a metal gate formed from metal material other than conventional poly-Si or WSi. Even in these processing operations, a desire exists for developing a resist-residue stripper which satisfies requirements; that is, a sufficient characteristic of removing residues, and avoidance of etching of the material of an interconnection and the material of an interlayer insulation film.

SUMMARY OF THE INVENTION

According to one aspect of the present invention, in a method of manufacturing a semiconductor device, either of an aluminum film, a tungsten film or a copper film is formed on a base layer laid on a substrate. A pattern of said aluminum film, a tungsten film or a copper film is formed from said aluminum film, tungsten film or copper film through use of a resist pattern and by means of photolithography. Further, the resist is removed through use of a chemical which contains an organic acid or a salt thereof and water and which has a pH below 8.

According to another aspect of the present invention, in a method of manufacturing a semiconductor device, either of an aluminum film, a tungsten film or a copper film is formed on a base layer laid on a substrate. A pattern of said aluminum film, a tungsten film or a copper film is formed from said aluminum film, tungsten film or copper film through use of a resist pattern and by means of photolithography. An interlayer dielectric film is formed on said pattern of an aluminum film, a tungsten film or a copper film. A hole pattern is formed in said interlayer dielectric film so as to reach said pattern of an aluminum film, a tungsten film or a copper film, through use of another resist mask and by means of photolithography. Thereafter, the resist is removed through use of a chemical which contains an organic acid or a salt thereof and water and which has a pH below 8.

According to another aspect of the present invention, in a method of manufacturing a semiconductor device, a composite metal film is formed on a base layer laid on a substrate. A pattern of said composite metal film is formed from said composite metal film through use of resist pattern and by means of photolithography. Further, the resist is removed through use of a chemical which contains an organic acid or a salt thereof and water and which has a pH below 8.

Other and further objects, features and advantages of the invention will appear more fully from the following description.

DETAILED DESCRIPTION OF THE PREFERRED EMBODIMENTS

First Embodiment

A first embodiment relates to a method of removing resist or resist residues, through use of a stripper which contains an organic acid or salt thereof and water, and which has a pH below 8, in a process in which Al, W, Ti, TiN, and $SiO_2$ are exposed on the surface of a wafer after etching of an Al interconnection.

Figure 1:
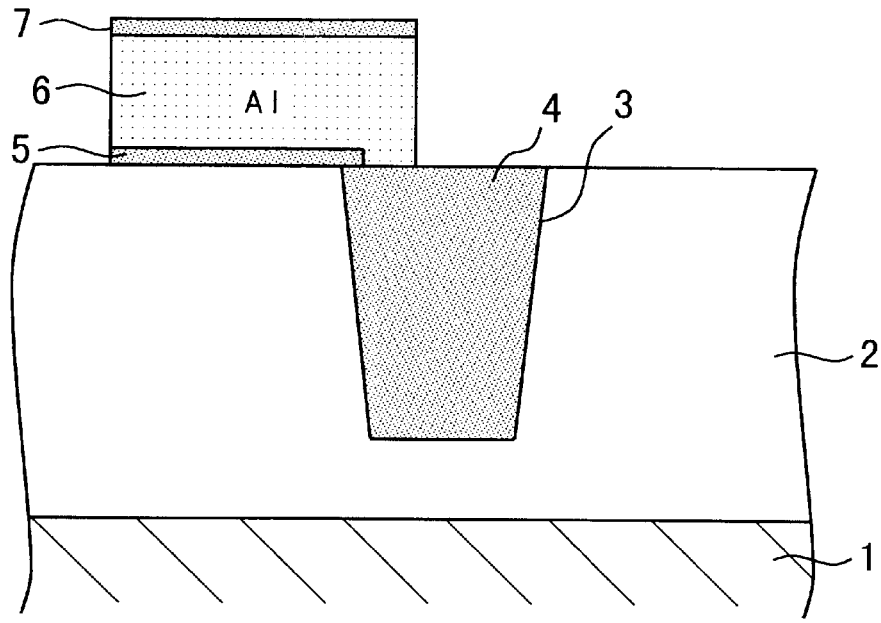
FIG. 1 is a cross-sectional view showing an Al interconnection on a wafer from which resist residues have been removed under a method of manufacturing a semiconductor device according to a first embodiment of the present invention.
Figure 2:
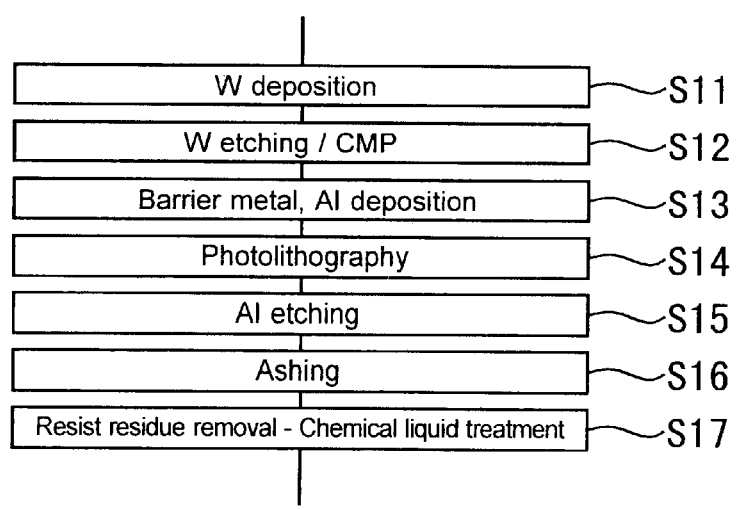
FIG. 2 is a flowchart showing a process of removing resist residues on a Al interconnections on a wafer under a method of manufacturing a semiconductor device according to the first embodiment of the present invention.

FIG. 1 is a cross-sectional view showing a wafer from which resist residues have been removed after processing of Al interconnections, under a method of manufacturing a semiconductor device according to a first embodiment of the present invention. FIG. 2 is a flowchart showing example processes of processing Al interconnections.

With reference to FIGS. 1 and 2, under a method of manufacturing a semiconductor device according to the first embodiment, W (tungsten) is deposited into a trench 3 (junction hole) of an interlayer dielectric film 2 laid on a semiconductor substrate 1 (step S11 shown in FIG. 2). Next, W is etched back or subjected to chemical-and-mechanical polishing (CMP), to thereby remove W from the upper surface of the interlayer dielectric film 2. Thus, a W plug 4 is formed in the trench 3 (step 12).

Next, a barrier metal layer 5, an Al film 6, and a barrier metal layer 7 are formed (step S13). A desired resist mask (not shown) is formed by means of photolithography (step S14). The barrier metal layer 7, Al film 6 and the barrier metal layer 5 are etched, to thereby form a desired Al film pattern 6 (step S15). The resist mask (not shown) is removed by means of ashing (step S16). Resist residues are removed by a chemical, as a resist-residue stripper, which contains an organic acid or salt thereof and water and which has a pH below 8 (step S17).

Another method of manufacturing a semiconductor device according to the first embodiment is the same as the foregoing method up to a step of forming a desired Al film pattern 6 (step S15). The next step of removing the resist mask through ashing (step S16) is not performed. Subsequent to a process of forming an aluminum film pattern 6 (step S15), the resist mask is removed by using a chemical, as a resist-residue stripper, which contains an organic acid or salt thereof and water and which has a pH below 8 (step S17).

In connection with the first embodiment and a second embodiment, which will be described later, examples of an organic acid or a salt thereof include carboxylic acid, peroxy acid, carbonate, thiocarboxylic acid, mercaptan, sulfonic acid, sulfinic acid, sulfenic acid, sulphate, phosphoic acid, phosphatidic acid, phosphoric ester, phosphine, and a complex compound of ester of boric acid.

Further examples of an organic acid or salt thereof include a straight-chain saturated monocarboxylic acids having 1 to 6 carbons such as formic acid, acetic acid, and propionic acid; saturated polycarboxylic acids such as oxalic acid, malonic acid, methylmalonic acid, and succinic acid; hydroxyl carboxylic acids such as lactic acid, gluconic acid, tartaric acid, malic acid, and citric acid; amino carboxylic acids such as glycine, DL-alanine, 4-aminobutyric acid, DL-3-amino acid, and sarcosine; and alkoxyl carboxylic acids such as methoxy acetic acid and ethoxy acetic acid.

Further examples of salts of organic acids include a salt formed from organic acid, and a basic organic compound or a basic inorganic compound. Basic organic compounds include primary amine, secondary amine, tertiary amine, imine, alkanolamine, amide, heterocyclic compound, and quaternary ammonium hydroxide. Further, basic compounds include ammonia, sodium hydroxide, potassium hydroxide, and calcium hydroxide. In terms of prevention of mixing of metal ions into an organic acid or salt thereof, an ammonium salt of an organic acid and a salt formed from an organic acid and a basic organic acid compound are preferable. An organic acid salt may be used solely or in combination of two or more types.

Of these acids, a polycarboxylic acid is superior in terms of removal of resist.

In order to achieve a superior resist removal characteristic, a chemical according to the present invention must contain 0.01 to 90 wt. % of organic acid or a salt thereof. In terms of a resist removal characteristic and prevention of corrosion of metal material, the content is preferably 0.05 wt. % to 70 wt. %, more preferably 0.1 to 50 wt. %.

Water to be mixed with the chemical according to the present invention is preferably ion-exchange water, an ionic substance such as pure water or a ultrapure water, or water whose particles are minimized, in consideration of employment of the chemical in the field of manufacture of a semiconductor element or LCD.

In terms of improvement in a resist removal characteristic, a chemical must contain 2 to 74 wt. % water, which is a feature of the present invention. By means of regulating water content within such a range, there can be produced a stripper composition which has a superior resist removal characteristic and prevents corrosion of metal material. In terms of a resist removal characteristic and prevention of corrosion of metal material, water content is preferably 5 to 70 wt. %, more preferably 10 to 60 wt. %, particularly preferably 15 to 50 wt. %.

In the present invention, a chemical having a pH below 8 is used in view that a chemical having a pH equal to or above 8 fails to provide a superior resist removal characteristic or polymer removal characteristic. So long as the pH of the chemical is controlled to a value of less than 8, the chemical achieves a sufficient resist removal characteristic and prevents corrosion of metal material.

The need for the present invention and the background thereof will now be described.

In a process of forming an interconnection of a recent minute device, an interconnection (corresponding to the Al interconnection 6 shown in FIG. 1) is scaled down to the same size as that of a junction hole (corresponding to the trench 3 shown in FIG. 1), as a result of which the junction hole is incompletely covered with the interconnection. Thus, such an interconnection which is offset from the junction hole and which exposes the surface of the junction hole after formation of the interconnection, as shown in FIG. 1, is called a borderless interconnection (or a mis-aligned interconnection). During a dry process, such as an etching process or an ashing process, the borderless interconnection is electrified. As a result, a W plug may disappear while resist residues are removed through use of a resist-reside stripper. In addition to disappearance of a W plug, a local battery effect induces etching of the Al interconnection laid on the W plug, narrowing of the Al interconnection, or etching of Al located in the vicinity of Cu contained in the Al interconnection. As a result, Cu is precipitated, which in turn induces a decrease in a formation yield of interconnection, an increase in the resistance of an interconnection, and a decline of reliability of an interconnection.

The interval between interconnections is narrowed as a device is scaled down. In order to prevent occurrence of a short circuit between interconnections and to reduce capacitance developing between interconnections, a geometry of Al interconnection is desired to be closer to the perpendicular and not tapered. In order to selectively etch Al perpendicularly, there may be a case where an etching gas is deliberately mixed into an etching gas for causing a deposit resistant to etching to adhere to the side wall of an upper layer portion of the thus-etched Al interconnection. As a result, residues which are difficult to remove adhere to the side wall of the Al interconnection after etching.

In an ordinary multilayer interconnection construction, a layer which transfers a signal of comparatively low current signal, such as a transmission signal output from a transistor, is formed in a lower layer through use of a thin Al film. In contrast, an interconnection, such as an interconnection for a power circuit, which permits flow of a large amount of electric current is usually formed in an upper layer through use of a thick Al film in order to reduce the resistance of an interconnection. As an Al film becomes thick, greater etch selectivity is desired, and resist residues which are difficult to remove are eventually formed after etching. Usually, there is a trade-off between a resist-residue removal characteristic and etching of AlCu. If the resist-residue removal characteristic of a resist stripper is improved, the amount of AlCu to be etched is increased. For this reason, a resist stripper capable of diminishing narrowing of an Al interconnection is used for removing a lower thin Al film which is relatively easy to remove. In contrast, a resist stripper having a high resist-residue removal characteristic is used for removing an upper thick Al film from which residues are relatively difficult to remove, at the sacrifice of slight narrowing of an Al interconnection.

In order to solve the foregoing problem, the present invention employs a chemical which contains an organic acid or salt thereof and water and which has a pH below 8, as a resist-residue stripper or a resist stripper. It is admitted that the chemical employed by the present invention shows a sufficient characteristic of removing residues and an effect of suppressing failures, which would otherwise be caused after processing of Al interconnections.

Second Embodiment

A second embodiment relates to a method of removing resist or resist residues, through use of a stripper which contains an organic acid or a salt thereof and water and has a pH below 8, in a process in which Al, W, Ti, TiN, and $SiO_2$ are exposed on the surface of a wafer after etching a hole reaching an Al interconnection in an dielectric layer.

Figure 3:
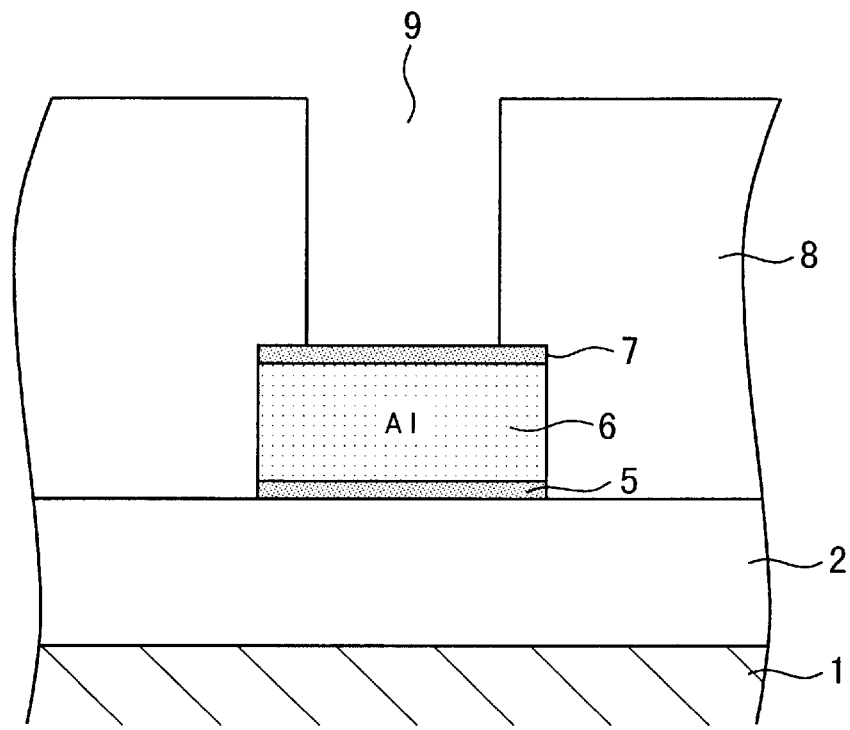
FIG. 3 is a cross-sectional view showing a hole on an Al interconnection on a wafer from which resist residues have been removed under a method of manufacturing a semiconductor device according to a second embodiment of the present invention.
Figure 4:
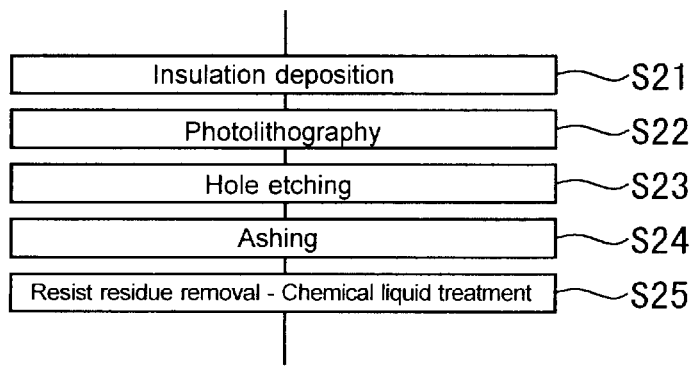
FIG. 4 is a flowchart showing a process of removing resist residues on a Al interconnections according to the second embodiment of the present invention.

FIG. 3 is a cross-sectional view showing a wafer from which resist residues are removed after a hole has been formed so as to communicate with an Al interconnection by means of etching, under a method of manufacturing a semiconductor device according to the second embodiment of the present invention. FIG. 4 is a flowchart showing example processes for processing Al interconnections under the method of manufacturing a semiconductor device according to the second embodiment.

By reference to FIGS. 3 and 4, under a method of manufacturing a semiconductor device according to the second embodiment, the barrier metal layer 5, the Al film 6, and the barrier metal layer 7 are formed on the interlayer dielectric film 2 laid on the semiconductor substrate 1, in the sequence given. The barrier metal layer 7, the Al film 6 and the barrier metal layer 5 are patterned through use of a resist mask (not shown) and by means of photolithography. The interlayer dielectric film 8 is formed on the Al film pattern 6 (step S21 shown in FIG. 4). Through use of another resist mask (not shown) and by means of photolithography (step S22), the hole pattern 9 is formed in the interlayer dielectric film 8 so as to reach the Al film pattern 6 (step S23). The resist mask is removed by means of ashing (step S24). Resist residues are removed while a stripper, which contains an organic acid or a salt thereof and water and has a pH below 8, is used as a resist-residue stripper (step S25).

Another method of manufacturing a semiconductor device according to the second embodiment is the same as the foregoing method up to a step of forming, in the interlayer dielectric film 6, the hole pattern 9 so as to reach the aluminum film pattern 4 (step S23) by way of a resist mask. The next step of removing the resist mask through ashing (step S24) is not performed. Subsequent to a process of forming the hole pattern 9 (step S23), the resist mask is removed by using a chemical, as a resist-residue stripper, which contains an organic acid or a salt thereof and water and has a pH below 8 (step S25).

The need for the present invention and the background thereof will now be described.

In a process of forming a hole in a recent minute device, the aspect ratio of a hole (corresponding to the hole 9 shown in FIG. 3); that is, a ratio of the thickness of an interlayer dielectric film to a hole diameter, tends to increase. In a case where a hole having a large aspect ratio is cleaned, the efficiency of replacement of a chemical in a hole is lower than under normal circumstances, and hence the residue-removal characteristic of the chemical is deteriorated. The chemical that has entered the hole still remains in the hole and may cause abnormal etching of AlCu or barrier metal. A residual chemical component may induce an increase in interfacial resistance, which in turn cause a decline in the reliability of an interconnection.

In the case of etching of an interconnection, AlCu and a barrier metal are subjected to etching. In the case of etching of a hole, an interlayer dielectric film is subjected to etching. Thus, these etching operations differ from each other in terms of an object of etching. If an object of etching differs, an etching gas of different type and different etching conditions will be required. For this reason, extraneous residues may be formed after an etching operation.

An interlayer dielectric film is usually formed from heterogeneous dielectric films into a multilayer structure. In contrast with a case where residues resulting from etching of an Al interconnection below which a dielectric film of one type is exposed, strict demand exists for a chemical to avoid etching of an interlayer dielectric film, from the viewpoint of avoidance of an increase in hole diameter. If the amount to be etched by a resist stripper differs according to the types of dielectric films constituting the interlayer dielectric film, unevenness arises in the interior surface of the hole. Such unevenness may induce a failure in growth of the next barrier metal layer which is to be formed by means of sputtering, thereby causing voids. The voids cause significant decline in the reliability of an interconnection.

For these reasons, a chemical of one type is used for removing residues resulting from etching of an interconnection, and a chemical of another type must be used for removing residues resulting from etching of holes.

In order to eliminate the above problems, the present invention employs a chemical which contains an organic acid or salt thereof and water and which has a pH below 8, as a resist-residue stripper or a resist stripper. The chemical according to the present invention can be used for removing residues resulting from etching of holes as well as residues resulting from Al interconnections. Thus, the chemical can be expected to attain a stable characteristic of a device and a reduction in manufacturing costs.

Third Embodiment

A third embodiment of the present invention relates to a method of removing resist or resist residues through use of a stripper which contains an organic acid or a salt thereof and water and which has a pH below 8, in a process in which Cu is exposed on the surface of a semiconductor wafer after dry-etching of a Cu interconnection or etching of an interlayer dielectric film laid on a Cu interconnection.

Further, the present embodiment relates to a method of removing resist or resist residues through use of a stripper which contains an organic acid or a salt thereof and water and has a pH below 8, in a process in which W is exposed on the surface of a semiconductor wafer after dry-etching of a W interconnection or etching of an interlayer dielectric film laid on a W interconnection.

Figure 5:
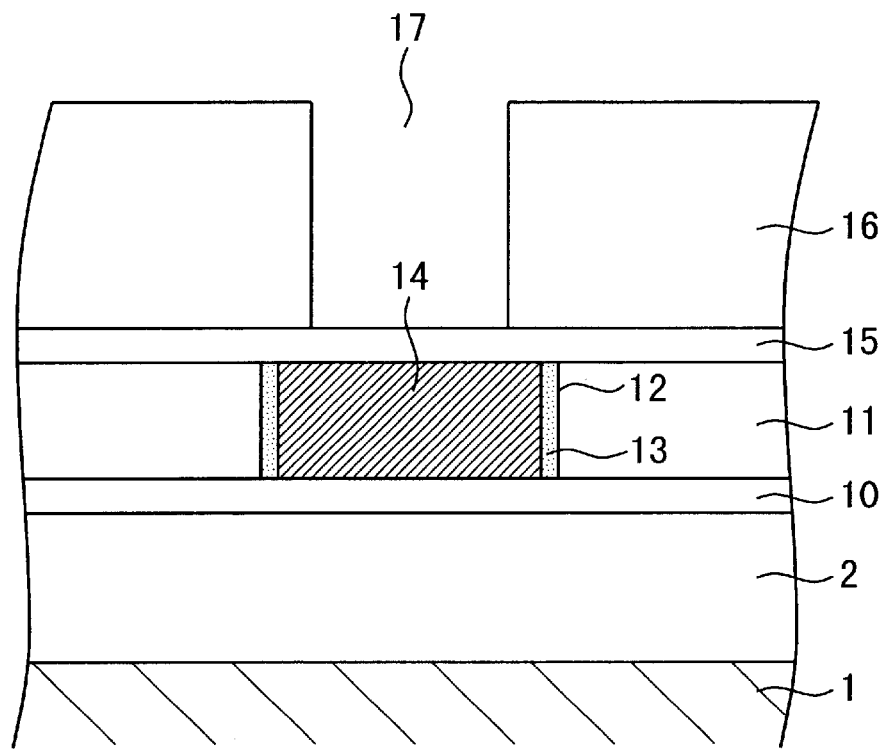
FIG. 5 is a cross-sectional view showing a hole on an Cu interconnection on a wafer from which resist residues have been removed under a method of manufacturing a semiconductor device according to a third embodiment of the present invention.
Figure 6:
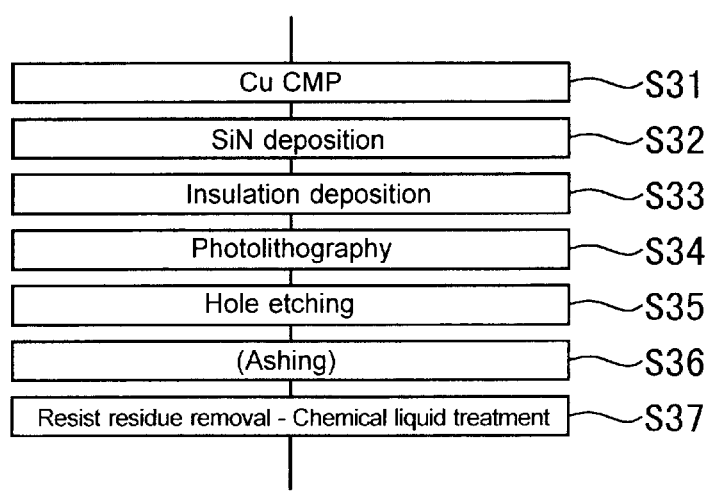
FIG. 6 is a flowchart showing a process of removing resist residues on a Cu interconnections according to the third embodiment of the present invention.

FIG. 5 is a cross-sectional view showing a wafer from which resist residues are removed after a hole has been formed so as to communicate with a Cu interconnection by means of etching, under a method of manufacturing a semiconductor device according to the third embodiment of the present invention. FIG. 6 is a flowchart showing example processes for processing Cu interconnections under the method of manufacturing a semiconductor device according to the third embodiment.

With reference to FIGS. 5 and 6, under a method of manufacturing a semiconductor device according to the third embodiment, a Cu protective film 10 is formed on the interlayer dielectric film 2 laid on the semiconductor substrate 1, and an interlayer dielectric film 11 is formed on the Cu protective film 10. Further, a trench 12 is formed in the interlayer dielectric film 11, and a Cu film 14 whose side surface is coated with a barrier metal layer 13 is formed within the trench 12. The top of the thus-formed Cu film 14 is smoothed by means of chemical-and-mechanical polishing (CMP) (step S31 shown in FIG. 6).

A Cu protective film 15 (for example, a SiN film) is deposited on the wafer (step S32), and an interlayer dielectric film 16 is further deposited on the Cu protective film 15 (step 33). A hole pattern 17 is formed in the interlayer dielectric film 16 through use of another resist mask (not shown) and by means of photolithography (step S34), so as to reach the Cu protective film 15 and the Cu film 14 (step S35).

The latter resist mask (not shown) is removed by means of ashing (step S36). Resist residues are removed while a stripper which contains an organic acid or a salt thereof and water and has a pH below 8 is used as a resist-residue stripper (step S37).

Another method of manufacturing a semiconductor device according to the third embodiment is the same as the foregoing method up to a step of forming, in the interlayer dielectric film 6, the hole pattern 17 so as to reach the Cu protective film 15 and the Cu film pattern 14 by way of a resist mask (step S35). The next step of removing the resist mask through ashing (step S36) is not performed. Subsequent to the process of forming the hole pattern 17 (step S35), the latter resist mask is removed by using a chemical, as a resist-residue stripper, which contains an organic acid or a salt thereof and water and has a pH below 8 (step S37).

The need for the present invention and the background thereof will now be described.

Various structures have been put forward for the structure of a Cu interconnection. In the present embodiment, a dual damascene structure is employed as an example structure for a Cu interconnection. There is a high probability that a Cu interconnection will be subjected to an ashing-less process, for the following two reasons. Therefore, demand exists for developing a resist striper having the ability to dissolve bulk resist.

Cu is a metal which is susceptible to oxidation. Therefore, if Cu is subjected to an ordinary resist ashing operation through use of an oxygen plasma, the surface of Cu is oxidized. A majority of strippers dissolve Cu oxides. In a dual damascene structure which is obtained by means of subjecting a wafer to an ashing operation and a residue-removal operation several times, Cu is eventually etched at each stripping operation, which may include decline in the reliability of an interconnection.

Of insulation films having low dielectric constants whose introduction will be pursued in the future for the purpose of preventing a delay in interconnections, organic dielectric films are etched by oxygen plasma. Some insulation films cannot be subjected to an ordinary resist ashing operation. In a case where there is used an insulation film having such a characteristic, an ashing-less manufacturing process is imperative.

In order to solve such a problem, the present invention employs a chemical which contains an organic acid or a salt thereof and water and has a pH below 8. The chemical can be used for removing residues which are generated when a hole is etched so as to communicate with a Cu interconnection. Further, the chemical has a resist dissolving power and, hence, can implement an ashing-less process.

Although the above example has described the method of removing residues which would be caused by etching a hole so as to communicate with a Cu interconnection, the present invention can be applied to both a Cu interconnection and a W interconnection. Detailed description of the method will be omitted.

Although not illustrated, even in the third embodiment a Cu interconnection can be formed in the same structure as that shown in FIG. 1. The following description is based on the assumption that the Al interconnection 6 shown in FIG. 1 is replaced with the Cu interconnection 6.

Under a method of manufacturing a semiconductor device according to a third embodiment (with reference to FIG. 1 and FIG. 2), a conductive section 4 is formed in the interlayer dielectric film 2 (a base layer) laid on the semiconductor substrate 1. The Cu interconnection layer 6 is formed on the interlayer dielectric film 2. A Cu film pattern 6 is formed from the Cu interconnection layer 6 for establishing an electrical connection with the conductive section 4, through use of resist and by means of photolithography. The resist is subjected to ashing. Residues are removed by use of a chemical which contains an organic acid or a salt thereof and water and has a pH below 8.

Another method of manufacturing a semiconductor device according to the third embodiment is the same as the foregoing method up to a step of forming the Cu pattern 6. The next step of removing the resist mask through ashing is not performed. Subsequent to the process of forming the Cu pattern 6, the resist mask is removed through use of a chemical which contains an organic acid or a salt thereof and water and has a pH below 8.

The foregoing description has described the method of removing resist residues, in a process in which Cu is exposed on the surface of a semiconductor wafer after dry etching of a Cu interconnection or after a hole has been formed in an interlayer dielectric film laid on a Cu interconnection through etching.

The foregoing description also applies to a method of removing resist residues, in a process in which W is exposed on the surface of a semiconductor wafer after dry etching of a W interconnection or after a hole has been formed in an interlayer dielectric film laid on a W interconnection through etching. The Cu interconnection used in the foregoing description is to be replaced with a W interconnection. Hence, repeated explanation is omitted.

Fourth Embodiment

A fourth embodiment relates to a method of removing resist or resist residues, through use of a stripper which contains an organic acid or a salt thereof and water and which has a pH below 8, in a process in which metal material such as W, WN, Ti, or TiN; poly-Si; SiN; and $SiO_2$ are exposed on the surface of a wafer after etching of a metal gate.

Figure 7:
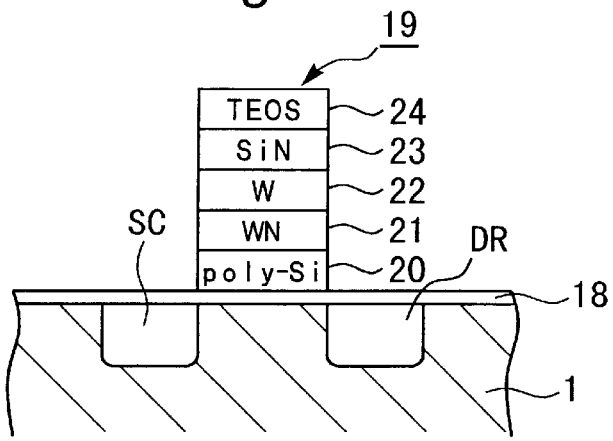
FIG. 7 is a cross-sectional view showing a metal gate structure on a wafer from which resist residues are removed under a method of manufacturing a semiconductor device according to the fourth embodiment of the present invention.
Figure 8:
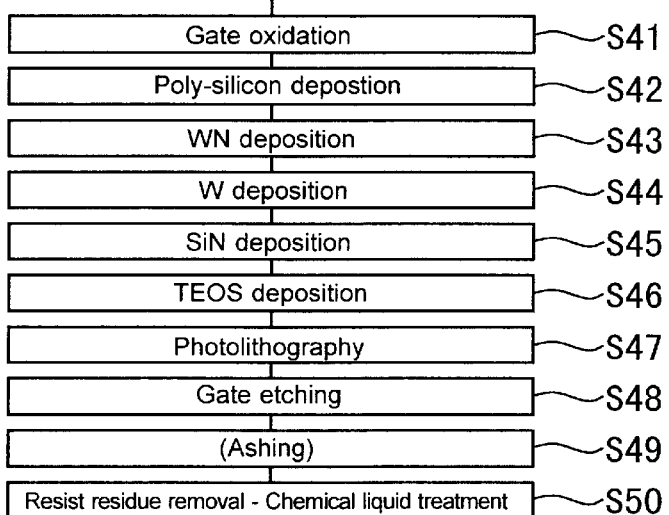
FIG. 8 is a flowchart showing a process of removing resist residues on a metal gate structure according to the fourth embodiment of the present invention.

FIG. 7 is a cross-sectional view showing a wafer from which resist residues are removed after etching of a gate of a metal gate structure, under a method of manufacturing a semiconductor device according to the fourth embodiment of the present invention. FIG. 8 is a flowchart showing example processes of forming a metal gate, under the method of manufacturing a semiconductor device according to the fourth embodiment.

With reference to FIGS. 7 and 8, under a method of manufacturing a semiconductor device according to the fourth embodiment, a gate oxide film 18 (a base layer) is formed on the substrate 1 (step S41 shown in FIG. 8), and a composite metal film 19 is formed on the gate oxide film 18. The composite metal film 19 is formed by means of depositing a polysilicon film 20 (step S42), a WN film 21 (step S43), a W film 22 (step S44), an SiN film 23 (step S45), and a TEOS film 24 (step S46), in the sequence given.

A composite metal film pattern 19 is formed (step S48) from the composite metal film 19 through use of a resist mask (not shown) and by means of photolithography (step S47). The resist mask is removed by means of ashing (step S49). Subsequently, resist residues are removed while there is used, as a resist-residue stripper, a chemical which contains an organic acid or a salt thereof and water and which has a pH below 8. Afterwards, a source electrode SC and a drain electrode DR are formed in the substrate 1.

Another method of manufacturing a semiconductor device according to the fourth embodiment is the same as the foregoing method up to a step of forming the composite metal film pattern 19 through photolithography (step S48). The next step of removing the resist mask through ashing (step S49) is not performed. Subsequent to the process of forming the composite metal film pattern 19, the resist mask is removed while there is used, as a resist stripper, a chemical which contains an organic acid or a salt thereof and water and has a pH below 8.

Under still another method of manufacturing a semiconductor device according to the fourth embodiment, a combination selected from the metal material including W, WN, Ti, and TiN; a conductive material containing poly-Si; and a dielectric material including SiN and $SiO_2$ is used as the composite metal film 19.

The need for the present invention and the background thereof will now be described.

In connection with future devices, it is considered that, rather than conventionally-employed poly-Si and WSi, a metal material such as W, WN, Ti, or TiN will be used for a metal gate in order to shorten a gate delay. In a case where W is used for a gate, W is etched by hydrogen peroxide. For this reason, W cannot be subjected to a popular RCA cleaning operation which has conventionally been performed. Since W is processed by an HF-based chemical, a desire exists for developing a process for removing residues which would be generated by an etching operation using an organic stripper.

An oxygen ashing operation which has widely been used for removing resists imparts damage to an Si substrate or a gate oxide film, which may in turn deteriorate the characteristic of a transistor. Therefore, a desire exists for developing an ashing-less process.

In order to solve the problem, the present invention employs a chemical which contains an organic acid or a salt thereof and water and which has a pH below 8. The chemical according to the present embodiment has an ability to remove resist residues which would be generated by etching a gate of a metal gate structure. Further, the chemical can be used as one which does not imparts damage to a metal gate during an etching operation.

Fifth Embodiment

A fifth embodiment relates to a method of removing resist or resist residues, through use of a stripper which contains an organic acid or salt thereof and water and which has a pH below 8, in a process in which metal material such as W, WN, Ti, or TiN; poly-Si; SiN; and/or $SiO_2$ are exposed on the surface of a wafer after implantation of impurity ions following etching of a metal gate.

Figure 9:
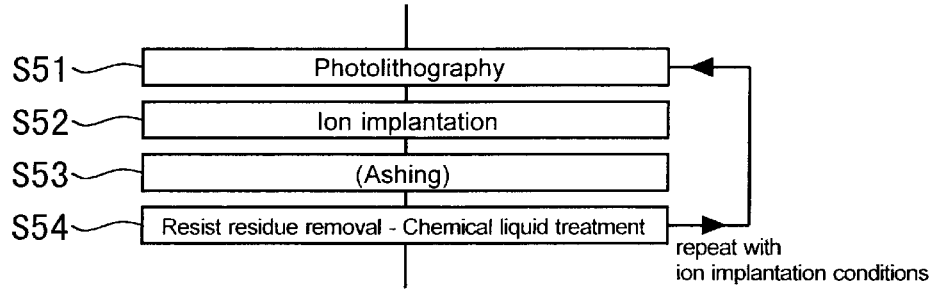
FIG. 9 is a flowchart showing a process of removing resist residues on a metal gate structure according to the fifth embodiment of the present invention.

FIG. 9 is a flowchart showing example processes before and after implantation of ions into a metal gate structure, under the method of manufacturing a semiconductor device according to the fifth embodiment. In the fifth embodiment, the wafer, from which resist has been removed after implantation of ions into the metal gate structure, is the same as that shown in FIG. 7.

With reference to FIGS. 7 through 9, under a method of manufacturing a semiconductor device according to the fifth embodiment, a gate oxide film 18 (a base layer) is formed on the substrate 1 (step S41 shown in FIG. 8), and a composite metal film 19 is formed on the gate oxide film 18 (steps S42 through S46 shown in FIG. 8). Through use of a resist mask (not shown) and by means of photolithography (step S47), a composite metal film pattern 19 is formed from the composite metal film 19 (step S48).

Another resist mask pattern is formed on the composite metal film pattern 19 by means of photolithography (step S51 shown in FIG. 9), and ions are implanted into the substrate 1 through the gate oxide film 18 (step S52). The latter resist mask is removed by ashing (step S53). Subsequently, resist residues are removed while there is used, as a resist-residue stripper, a chemical which contains an organic acid or a salt thereof and water and which has a pH below 8 (step S54). The steps S51 through S54 will be repeated with required ion implantation conditions.

Another method of manufacturing a semiconductor device according to the fifth embodiment is the same as the foregoing method up to a step of implanting ions into the substrate 1 (step S52). The next step of removing the resist mask through ashing (step S53) is not performed. Subsequent to the process of implanting ions into the substrate 1 (step S52), resist is removed while there is used, as a resist stripper, a chemical which contains an organic acid or a salt thereof and water and has a pH below 8 (step S54).

Under still another method of manufacturing a semiconductor device according to the fifth embodiment, a combination selected from the metal material including W, WN, Ti, and TiN, the conductive material containing poly-Si, and the dielectric material including SiN and $SiO_2$ is used as the composite metal film 19.

Under yet another method of manufacturing a semiconductor device according to the first through fifth embodiments, the chemical according to the present invention which serves as a resist stripper or a resist-residual stripper preferably further includes an organic solvent. The organic solvent promotes penetration of an organic acid into resist or polymer and/or penetration of the salt of an organic acid or a salt of water into resist or polymer, as a result of which a resist removal characteristic is improved.

Under another method of manufacturing a semiconductor device according to the first through fifth embodiments, a polycarboxylic acid is preferably used as an organic acid of the chemical according to the present invention, which chemical acts as a resist stripper or a resist-residue stripper. The reason for this is that a polycarboxylic acid is superior in terms of resist removal characteristic.

The need for the present invention and the background thereof will now be described.

In connection with future devices having improved characteristics, a shallow and high-density impurity implantation profile is desired for a source, a drain and a channel. A resist mask used for changing elements to be implanted according to the polarity of a transistor is degraded by high-density implantation. As a result, removal of a resist mask becomes more difficult. Further, in the process of forming a metal gate described in connection with the fourth embodiment, W, WN, Ti, or TiN; poly-Si; SiN; and $SiO_2$ are exposed. Therefore, the substrate cannot be subjected to an RCA cleaning operation or an excessive HF-based chemical processing operation. As in the case of the removal of resist residues after etching of a gate, a desire exists for developing a process of removing resist through use of an organic stripper after ion implantation.

As in the case of the fourth embodiment, a desire exists for developing an oxygen-ashing-less operation.

Various implantation conditions, such as elements to be implanted, implantation energy, and the amount to be implanted, are required, and resultant resist removal operations are performed many times, such as four to ten times. Further, material size used in a gate process is smaller than that used in an interconnection process. In consideration of these situation, an allowable amount to be etched is considerably reduced. Demand exists for suppressing the amount to be etched to 1 nm or less per etching operation.

In order to solve the problems, the present invention uses a stripper which contains an organic acid or a salt thereof and water and which has a pH below 8. The chemical according to the present invention has an advantage of ability to dissolve resist, thus yielding ability to remove resist after ion implantation. The chemical can be used as one which does not impart damage to a metal gate, which would otherwise be caused by etching.

Experiments

Removal of resist residues from a borderless interconnection, such as that illustrated in FIG. 1 according to the first embodiment, was tested while the type of chemicals were changed, wherein an interconnection (an Al film 6) is offset from a junction hole (a trench 3), and the surface of the junction hole remains exposed even after formation of an interconnection.

Table 1 shows the composition and pH of chemicals employed in the first through eighth examples, as well as evaluation of the test results thereof. Table 2 shows the composition and pH of chemicals employed in comparative examples 1 through 3 which were performed simultaneously with the first through eighth embodiments, as well as evaluation of test results thereof.

As shown in Table 1, test examples of chemicals were prepared in different compositions of (a) acetic acid, oxalic acid, malonic acid and tartaric acid, (b) water, (c) dimethylformamide, N-methyl-2-pyrolidone, dimethylsulfoxide and diethylene glycol monobutyl ether, and (d) vinyltrimethoxysilane, hexamethyldisilazane and aminopropyltrimethoxysilane. Comparative examples of chemicals were also prepared as shown in Table 2.

In the test, the chemicals provided in Tables 1 and 2 were preheated to a temperature of 50° C. Borderless wiring boards manufactured in the manner as shown in FIG. 1 in connection with the first embodiment were immersed in the chemicals. After having been immersed in the chemicals for 15 min., the borderless wiring boards were rinsed with isopropyl alcohol and subsequently rinsed with purified water. After having been dried, the borderless wiring boards were observed under a scanning electron microscope (SEM) at about 30,000 magnifications, thereby evaluating removal of resist residues, thinning of an aluminum interconnection, and disappearance/presence of a W plug according to a method which will be described below. Evaluation results appear in evaluation columns of Tables 1 and 2.

Removal of resist residues was evaluated by means of observing the surface of a wafer through an SEM at about 30,000 magnifications. Removal of resist residues is evaluated by means of photographs as follows.

Good: No resist residues are observed

Poor: Resist residues are observed

With regard to thinning of an aluminum interconnection, thinning of the aluminum film 6 shown in FIG. 1 was measured and evaluated according to the following criteria. Here, the expression "thinning of an interconnection" signifies a "difference between the original width of an interconnection and the width of a chemically-treated interconnection." The smaller a numerical value, the better the result. Here, rank A is the best grade Rank A: under 3 nm, Rank B: under 10 nm, Rank C: from 10 nm to 20 nm, and Rank D: 20 nm or more With regard to disappearance/presence of a W plug, the W plug 4 shown in FIG. 1 was observed under an SEM at about 30,000 magnifications. The thus-magnified W plug was evaluated according to the following criterion.

Preserved: W plug still remains,

Disappeared: W plug has disappeared

As is understood from Tables 1 and 2, in contrast with the semiconductor devices manufactured in comparative examples 1 through 3, the semiconductor devices manufactured in the first through eighth examples have achieved sufficient removal of resist residues, less thinning of an aluminum interconnection, and good preservation of a W plug.

Now, the features and the advantages of the present invention are summarized.

According to one aspect of the present invention, resist or resist residues are removed, through use of a stripper which contains an organic acid or a salt thereof and water and which has a pH below 8, in a process in which Al, W, Ti, TiN, and $SiO_2$ are exposed on the surface of a wafer after etching of Al interconnections.

A sufficient resist removal characteristic or resist-residue removal characteristic is ensured for Al interconnections, as well as prevention of etching of another interconnection material or interlayer dielectric film material.

According to another aspect of the present invention, resist or resist residues are removed through use of a stripper which contains an organic acid or a salt thereof and water and which has a pH below 8, in a process in which Cu (or W) is exposed on the surface of a semiconductor wafer after dry-etching of a Cu (or W) interconnection or etching of an interlayer dielectric film laid on a Cu (or W) interconnection.

A sufficient resist removal characteristic or a resist-residue removal characteristic is ensured for Cu or W interconnections, as well as prevention of etching of another interconnection material or interlayer dielectric film material.

According to still another aspect of the present invention, resist or resist residues are removed through use of a stripper which contains an organic acid or salt thereof and water and which has a pH below 8, in a process in which a metal material such as W, WN, Ti, or TiN; poly-Si; SiN; and $SiO_2$ are exposed on the surface of a wafer after etching of a metal gate, or in a process after ion implantation which is performed after etching of a metal gate.

A sufficient resist removal characteristic or a resist-residue removal characteristic is ensured for a multilayer metal film, as well as prevention of etching of another interconnection material or interlayer dielectric film material.

It is further understood that the foregoing description is a preferred embodiment of the disclosed device and that various changes and modifications may be made in the invention without departing from the spirit and scope thereof.

The entire disclosure of a Japanese Patent Applications No. 2000-180198, filed on Jun. 15, 2000 and No. 2000-224529, filed on Jul. 25, 2000 including specification, claims, drawings and summary, on which the Convention priority of the present application is based, are incorporated herein by reference in its entirety.

TABLE 1

| Examples | 1 | 2 | 3 | 4 | 5 | 6 | 7 | 8 |
|---|---|---|---|---|---|---|---|---|
| Composition of Chemical (wt. %) | | | | | | | | |
| (a) Acetic Acid | 10 | | | | | | | |
| Oxalic Acid | | 3 | | 3 | | | 3 | 3 |
| Malonic Acid | | | 10 | | 10 | | | |
| Tartaric Acid | | | | | | 60 | | |
| (b) Water | 50 | 70 | 40 | 69.9 | 40 | 35 | 69.9 | 69.9 |
| (c) Dimethylformamide | 40 | | | | | | | |
| N-methyl-2-pyrolidone | | | 50 | | 49.95 | | | |
| Dimethylsulfoxide | | | | | | | | |
| Diethylene Glycol Monobutyl Ether | | 27 | | 27 | | 4.9 | 27 | 27 |
| (d) Vinyltrimethoxysilane | | | | 0.1 | 0.05 | 0.1 | | |
| Hexamethyldisilazane | | | | | | | 0.1 | |
| Aminopropyltrimethoxysilane | | | | | | | | 0.1 |
| pH of Chemical | 2.5 | 1.4 | 1.5 | 1.4 | 1.5 | 0.2 | 1.4 | 1.4 |
| Evaluation | | | | | | | | |
| Removal of Resist Residues | good | good | good | good | good | good | good | good |
| Thinning of Al interconnection | A | C | A | B | A | B | B | A |
| Disappearance/preservation of W plug | P | P | P | P | P | P | P | P |

Thinning of Al interconnection
A: less than 3 nm
B: less than 10 nm
C: 10 nm to 20 nm
Disappearance/preservation of W plug
D: Disappeared - W plug has disappeared
P: Preserved - W plug remains

TABLE 2

| Comparative Examples | 1 | 2 | 3 |
|---|---|---|---|
| Composition of Chemical (wt. %) | | | |
| Monoethanolamine | 70 | | |
| Hydroxylamine | | | 17.5 |
| Ethylaminoethanol | | 89 | |
| Aminoethoxyethanol | | | 60 |
| (a) Phthalic Acid | 3 | | |

TABLE 2-continued

| Comparative Examples | 1 | 2 | 3 |
|---|---|---|---|
| (b) Water | | 5 | 17.5 |
| (c) Dimethylsulfoxide | 27 | | |
| Benzotriazole | | 1 | |
| Pyrocatechol | | 5 | 5 |
| pH of Chemical | 13.5 | 13.9 | 12 |
| Evaluation | | | |
| Removal of Resist Residues | poor | poor | good |
| Thinning of Al interconnection | A | C | A |
| Disappearance/preservation of W plug | P | D | D |

Thinning of Al interconnection
A: less than 3 nm
B: less than 10 nm
C: 10 nm to 20 nm
Disappearance/preservation of W plug
D: Disappeared - W plug has disappeared
P: Preserved - W plug remains

What is claimed is:

1. A method of manufacturing a semiconductor device, comprising the steps of: forming either of an aluminum film, a tungsten film or a copper film on a base layer laid on a substrate; forming an aluminum pattern, a tungsten pattern or a copper pattern from said aluminum film, tungsten film or copper film through use of a resist pattern and by means of photolithography; and removing the resist through use of a resist stripper which contains an organic acid or a salt thereof and water, wherein the resist stripper has a pH below 8.

2. The method of manufacturing a semiconductor device according to claim 1, further comprising the steps of: removing the resist through ashing, after forming said aluminum pattern, tungsten pattern or copper pattern and prior to using said resist stripper.

3. The method of manufacturing a semiconductor device according to claim 1, further comprising the step of: forming a barrier metal layer which adheres to at least either side of said aluminum film, tungsten film or copper film, prior to formation of said aluminum film, tungsten film or copper film and/or after formation of said aluminum film, tungsten film or copper film.

4. The method of manufacturing a semiconductor device according to claim 1, further comprising the step of: forming a conductive section in said base layer, prior to formation of said aluminum film, tungsten film or copper film, wherein said aluminum pattern, tungsten pattern or copper pattern is formed on said conductive section to be electrically connected thereto.

5. The method of manufacturing a semiconductor device according to claim 1, wherein an organic solvent is further included in said resist stripper.

6. The method of manufacturing a semiconductor device according to claim 1, wherein said organic acid comprises a polycarboxylic acid.

7. A method of manufacturing a semiconductor device, comprising the steps of: forming either of an aluminum film, a tungsten film or a copper film on a base layer laid on a substrate; forming an aluminum pattern, a tungsten pattern or a copper pattern from said aluminum film, tungsten film or copper film through use of a resist pattern and by means of photolithography; forming an interlayer dielectric film on said aluminum pattern, tungsten pattern or copper pattern; forming a hole pattern in said interlayer dielectric film so as to reach said aluminum pattern, tungsten pattern or copper pattern, through use of another resist mask and by means of photolithography; and removing the resist through use of a resist stripper which contains an organic acid or a salt thereof and water, wherein the resist stripper has a pH below 8.

8. The method of manufacturing a semiconductor device according to claim 7, further comprising the steps of: removing the resist through ashing, after forming a hole pattern and prior to using said resist stripper.

9. The method of manufacturing a semiconductor device according to claim 7, further comprising the step of: forming a barrier metal layer which adheres to at least either side of said aluminum film, tungsten film or copper film, prior to formation of said aluminum film, tungsten film or copper film and/or after formation of said aluminum film, tungsten film or copper film.

10. The method of manufacturing a semiconductor device according to claim 7, further comprising the step of: forming a conductive section in said base layer, prior to formation of said aluminum film, tungsten film or copper film, wherein said aluminum pattern, tungsten pattern or copper pattern is formed on said conductive section to be electrically connected thereto.

11. The method of manufacturing a semiconductor device according to claim 7, wherein an organic solvent is further included in said resist stripper.

12. The method of manufacturing a semiconductor device according to claim 7, wherein said organic acid comprises a polycarboxylic acid.

13. A method of manufacturing a semiconductor device, comprising the steps of: forming a composite metal film on a base layer laid on a substrate; forming a composite metal pattern from said composite metal film through use of resist pattern and by means of photolithography; and removing the resist through use of a resist stripper which contains an organic acid or a salt thereof and water, wherein the resist stripper has a pH below 8.

14. The method of manufacturing a semiconductor device according to claim 13, further comprising the steps of: removing the resist through ashing, after forming said composite metal pattern and prior to using said resist stripper.

15. The method of manufacturing a semiconductor device according to claim 13, further comprising the steps of: forming another resist mask pattern on said composite metal pattern, after forming said composite metal pattern, and implanting ions into said substrate; and removing the resist through use of a chemical which contains an organic acid or a salt thereof and water and which has a pH below 8.

16. The method of manufacturing a semiconductor device according to claim 15, further comprising the steps of: removing the resist through ashing, after implanting ions into said substrate and prior to using said chemical.

17. The method of manufacturing a semiconductor device according to claim 13, wherein said composite metal film comprises one or more metal materials selected from the group consisting of W, WN, Ti, and TiN; poly-Si as a conductive material; and a dielectric material comprising SiN and/or $SiO_2$.

18. The method of manufacturing a semiconductor device according to claim 13, wherein an organic solvent is further included in said resist stripper.

19. The method of manufacturing a semiconductor device according to claim 13, wherein said organic acid comprises a polycarboxylic acid.

* * * * *